US012704064B2

(12) United States Patent
Xu et al.

(10) Patent No.: US 12,704,064 B2
(45) Date of Patent: Aug. 11, 2026

(54) ADVANCED GEOLOGICAL PREDICTION METHOD AND SYSTEM BASED ON PERCEPTION WHILE DRILLING

(71) Applicant: SHANDONG UNIVERSITY, Jinan (CN)

(72) Inventors: Zhenhao Xu, Jinan (CN); Peng Lin, Jinan (CN); Shucai Li, Jinan (CN); Huihui Xie, Jinan (CN); Heng Shi, Jinan (CN); Zhaoyang Wang, Jinan (CN); Fumin Liu, Jinan (CN); Ruiqi Shao, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 1010 days.

(21) Appl. No.: 17/881,158

(22) Filed: Aug. 4, 2022

(65) Prior Publication Data

US 2023/0144184 A1 May 11, 2023

(30) Foreign Application Priority Data

Nov. 11, 2021 (CN) ......................... 202111330731.9

(51) Int. Cl.
*E21B 49/00* (2006.01)
*E21D 9/00* (2006.01)
*G06F 30/27* (2020.01)

(52) U.S. Cl.
CPC .......... *E21B 49/003* (2013.01); *E21B 49/005* (2013.01); *E21D 9/003* (2013.01); *G06F 30/27* (2020.01); *E21B 2200/20* (2020.05)

(58) Field of Classification Search
CPC .. E21B 49/003; E21B 49/005; E21B 2200/20; G06F 30/27; E21D 9/003

(Continued)

(56) References Cited

U.S. PATENT DOCUMENTS 9,747,393 B2 * 8/2017 Dasari .................... G01V 20/00
10,430,725 B2 * 10/2019 Anderson ............. G06N 20/00

(Continued)

FOREIGN PATENT DOCUMENTS

CN 110130883 A 8/2019
CN 111238982 A 6/2020
CN 112253049 A 1/2021

OTHER PUBLICATIONS

Zhang et al. (Prediction of geological conditions for a tunnel boring machine using big operational data, Automation in Construction 100 (2019) 73-83) (Year: 2019).*

(Continued)

*Primary Examiner* — Iftekhar A Khan
(74) *Attorney, Agent, or Firm* — Oliff PLC

(57) ABSTRACT

An advanced geological prediction method and system based on perception while drilling, and relates to advanced geological prediction. The solution includes: acquiring drilling parameters during drilling; obtaining physical and mechanical parameters of tunnel surrounding rocks by inversion based on drilling parameters; acquiring rock slag or powder based on flushing fluid collected during drilling; acquiring geochemical characteristic parameters of rock slag or powder; and obtaining at least one adverse geology recognition result and surrounding rock classification result using a pre-trained deep learning model, and realizing advanced geological prediction. Combined with advanced geological drilling, the solution reflects geological characteristics from changes of physical and mechanical properties of tunnel surrounding rocks and changes of geochemical characteristic parameters. Advanced prediction of geology ahead of a tunnel face is realized by collection and analysis of drilling parameters and flushing fluid during advanced (Continued)

drilling and the fusion of big data and a deep learning algorithm.

11 Claims, 2 Drawing Sheets

(58) Field of Classification Search
USPC ........................................................ 703/10
See application file for complete search history.

(56) References Cited

U.S. PATENT DOCUMENTS 11,263,809 B2 * 3/2022 Li ............................ G06T 7/97
11,435,499 B1 * 9/2022 Peredriy ................ E21B 49/00
11,693,140 B2 * 7/2023 Tawil ...................... G06N 3/09 706/12
11,774,614 B2 * 10/2023 Zhao ...................... G01V 1/003 367/7
11,846,184 B2 * 12/2023 Wang ...................... E21B 49/08
12,055,037 B2 * 8/2024 Mahiout ................ E21B 47/00
12,380,261 B2 * 8/2025 Ben-Zvi ................ E21B 43/128
2014/0372041 A1 * 12/2014 Prasad ................ G01V 11/002 702/11
2017/0218757 A1 * 8/2017 Li .......................... G01V 1/162
2017/0364795 A1 * 12/2017 Anderson .............. G06N 20/10
2019/0266501 A1 * 8/2019 Tavares .................... G06N 5/04
2020/0065606 A1 * 2/2020 Feng .................... G06N 3/0464
2020/0088897 A1 * 3/2020 Roy ..................... G06N 3/0464
2021/0003009 A1 * 1/2021 Zhou ....................... E21D 9/104
2021/0140298 A1 * 5/2021 Bakulin .................. G06F 18/24
2021/0319304 A1 * 10/2021 Tawil ...................... E21B 49/00
2021/0366186 A1 * 11/2021 Li ............................ G06T 7/97
2022/0011204 A1 * 1/2022 Tang ........................ G01N 3/42
2022/0187493 A1 * 6/2022 Smith .................... G06N 3/045
2022/0317021 A1 * 10/2022 Li .......................... G06N 20/00
2022/0351037 A1 * 11/2022 Li ...................... G01N 21/3563
2023/0093005 A1 * 3/2023 Lowell ................. G06N 3/0895 703/6
2023/0097859 A1 * 3/2023 AlSinan ................... G06N 3/09 703/6
2023/0141334 A1 * 5/2023 Wagner .................... G06N 5/01 706/12
2023/0145880 A1 * 5/2023 Solum ................. G06F 18/2431 382/173
2023/0184087 A1 * 6/2023 Lin ......................... E21B 47/04 702/6
2023/0222773 A1 * 7/2023 Zarian .................... G01V 20/00 382/109
2024/0193427 A1 * 6/2024 Falivene Aldea .... G06V 20/698
2025/0180770 A1 * 6/2025 Combs ................ E21B 47/0025

OTHER PUBLICATIONS

Xu et al. (Deep learning of rock images for intelligent lithology identification, Computers & Geosciences 154 (2021) 104799) (Year: 2021).*

Alimoradi et al. (Prediction of geological hazardous zones in front of a tunnel face using TSP-203 and artificial neural networks, Tunnelling and Underground Space Technology 23 (2008) 711-717) (Year: 2008).*

* cited by examiner

ADVANCED GEOLOGICAL PREDICTION METHOD AND SYSTEM BASED ON PERCEPTION WHILE DRILLING

TECHNICAL FIELD

The present disclosure belongs to the technical field of advanced geological prediction, and in particular, to an advanced geological prediction method and system based on perception while drilling.

BACKGROUND

The description in this section merely provides background information related to the present disclosure and does not necessarily constitute the prior art.

Tunnel construction is often accompanied with water and mud inrush, collapse, large deformation, and other geological disasters, causing heavy casualties, serious economic losses and adverse social impacts. The biggest cause and challenge faced by tunnel disasters are fault, karst and other adverse geologies. Due to complex underground geological conditions and limited technical means of surface exploration, it is difficult to accurately master adverse geology situations along a tunnel before construction. Advanced geological prediction as the most effective means to accurately detect fault, karst and other adverse geologies during the tunnel construction has been incorporated into relevant standards and become the core process of preventing and controlling tunnel construction disasters.

At present, the commonly used methods of tunnel adverse geological recognition and advanced geological prediction mainly include a geological analysis method, a geophysical prospecting method and an advanced drilling method. The advanced drilling method may directly reveal and infer geological characteristics of surrounding rocks ahead of a tunnel face, and is the most direct advanced geological prediction method. The process of the existing advanced drilling method is coring and recording a drilling process ahead of a face, observing the distribution of rock core structural surfaces and judging filler properties by geotechnical engineering personnel, and performing qualitative analysis and engineering classification on macroscopic characteristics of tunnel surrounding rocks, so as to complete the judgment of geological situations ahead of a tunnel face. Since relying heavily on manual analysis, this method can only qualitatively determine adverse geology and surrounding rock conditions, and is time-consuming, labor-intensive, strong in subjectivity, and large in error. In addition, this method is mainly based on a rock core for adverse geology recognition, is very low in utilization rate of other aspects of information during advanced drilling, is likely to omit judgments on adverse geology recognition and front engineering geological conditions, and has the disadvantage of limited outlook.

In fact, the rock core which can be observed and judged by constructors can be acquired during advanced drilling, and drilling parameters thereof also contain a lot of information capable of directly reflecting physical and mechanical parameters of tunnel rock mass ahead of the tunnel face. In addition, rock slag and rock powder carried in a flushing fluid during drilling also contains a lot of information capable of directly reflecting geological characteristics of rock mass ahead of the tunnel face. Common adverse geologies in tunnels mainly include fault fracture zones, karst, alteration zones, weathering zones, etc. The rock mass in the above-mentioned adverse geologies and influence areas thereof is quite different from normal surrounding rocks. The biggest difference between the rock mass in the adverse geologies and influence thereof and the normal surrounding rocks of tunnels is physical and mechanical properties. The rock mass in the adverse geologies and influence areas thereof is generally weak, broken and filled with clay and water. Therefore, the rock mass has poor integrity and low mechanical strength. Also, geochemical characteristics of the rock mass in the adverse geologies and influence areas thereof are greatly different from those of the normal surrounding rocks. Most typically, abnormal elements and minerals generally appear in the adverse geologies and influence areas thereof, including loss, enrichment, and the like of some special and iconic minerals and elements. During the recognition and prediction of adverse geologies, parameter change characteristics of tunnel surrounding rocks may reflect positions, scales, mechanical properties, rock integrity, and the like of the adverse geologies. Geochemical characteristics of the tunnel surrounding rocks may reflect characteristics such as types and filler properties of the adverse geologies. Therefore, the characteristics of the tunnel surrounding rocks and the adverse geologies reflected by the above-mentioned two parameters are complementary. Only by effectively combining and analyzing the above-mentioned two parameters, the conditions of the tunnel surrounding rocks and the adverse geologies can be refined and accurately recognized, so as to improve the comprehensiveness and accuracy of advanced geological prediction results for tunnels. However, the existing methods gives no consideration to the above-mentioned problems.

According to the search of the inventors, the use of drilling parameters in the prior art (CN112253049A, CN111238982A, CN110130883A, etc.) mainly concentrates on the testing of specific mechanical properties of a certain rock mass, such as compressive strength or abradability which cannot achieve continuous testing and macroscopic reaction of the mechanical properties of rock mass ahead of a tunnel face, and even cannot recognize the adverse geologies. The technology of testing geochemical characteristics of rock mass while drilling is still blank. Also, in order to analyze physical and mechanical properties and geochemical characteristics of surrounding rocks during drilling in the prior art, on-site sampling (it should be noted that it takes several hours to reach a tunnel face from a tunnel entrance of a tunnel of several kilometers) and physical and mechanical testing and geochemical characteristic testing in a laboratory are needed. Thus, this method is also time-consuming and labor-intensive.

SUMMARY

To solve the above-mentioned problems, the present disclosure provides an advanced geological prediction method and system based on perception while drilling. According to the method, in combination with advanced geological drilling, by means of the collection and analysis of drilling parameters and a flushing fluid during advanced drilling, the solution comprehensively reflects geological characteristics ahead of a tunnel face from changes of physical and mechanical properties of tunnel surrounding rocks and changes of geochemical characteristic parameters. Moreover, the advanced prediction of engineering geological conditions ahead of a tunnel face is realized finally by means of the fusion of big data and a deep learning algorithm.

According to a first aspect of embodiments of the present disclosure, provided is an advanced geological prediction method based on perception while drilling, including:

acquiring drilling parameters during drilling;

obtaining physical and mechanical parameters of tunnel surrounding rocks by inversion based on the drilling parameters;

acquiring rock slag or rock powder based on a flushing fluid collected during drilling;

acquiring geochemical characteristic parameters of the rock slag or the rock powder; and analyzing, according to the acquired physical and mechanical parameters of tunnel surrounding rocks and geochemical characteristic parameters, engineering geological conditions ahead of a tunnel face by using a pre-trained deep learning model, obtaining at least one of an adverse geology recognition result and a surrounding rock classification result, and then realizing advanced geological prediction.

As a further limitation, the physical and mechanical parameters of tunnel surrounding rocks include compressive strength, cohesion, internal friction angle, abradability, and integrity of rock mass.

As a further limitation, the geochemical characteristic parameters include types and content of elements in rock mass, types and content of minerals, and types and content of anions and cations in an aqueous solution.

As an optional implementation, training of the deep learning model specifically includes:

constructing a training set for adverse geology recognition based on an existing data set, and training the deep learning model by using the training set to obtain a trained adverse geology recognition model;

and constructing a training set for surrounding rock classification based on the existing data set, and training the deep learning model by using the training set to obtain a trained surrounding rock classification model.

As a further limitation, a process of mining the existing data set includes: collecting physical and mechanical parameters of compressive strength, cohesion, internal friction angle, abradability, and integrity of rock mass in various adverse geologies and influence areas thereof on a tunneling route, as well as types and content of elements, types and content of minerals, and types and content of anions and cations in an aqueous solution, and mining, based on a data mining mode, physical and mechanical parameters capable of reflecting geology precursor characteristic information and geochemical characteristic gradual evolution information in the rock mass on the tunneling route.

As an optional implementation, the corresponding deep learning model is continuously updated and optimized according to the physical and mechanical parameters of tunnel surrounding rocks, the geochemical characteristic parameters and the adverse geology recognition result as a drilling process progresses;

and the corresponding deep learning model is continuously updated and optimized according to the physical and mechanical parameters of tunnel surrounding rocks, the geochemical characteristic parameters and the surrounding rock classification result.

As an optional implementation, the deep learning model performs multi-level characteristic extraction on input data by using fully connected layers and residual fully connected layers while introducing an attention mechanism.

As an optional implementation, a process of fusing input data of the deep learning model specifically includes: performing characteristic extraction on the input data respectively based on the fully connected layers, and concatenating extracted characteristics.

As a further limitation, the obtaining physical and mechanical parameters of tunnel surrounding rocks by inversion based on the drilling parameters specifically includes: constructing a mapping relation between the drilling parameters and the physical and mechanical parameters of tunnel surrounding rocks based on historical data; and determining the physical and mechanical parameters of tunnel surrounding rocks based on the mapping relation and the acquired drilling parameters.

According to a second aspect of embodiments of the present disclosure, provided is an advanced geological prediction system based on perception while drilling, including:

a drilling parameter acquisition unit, configured to acquire drilling parameters during drilling;

a physical and mechanical property analysis unit, configured to obtain physical and mechanical parameters of tunnel surrounding rocks by inversion based on the drilling parameters;

a rock slag collection unit, configured to acquire rock slag or rock powder based on a flushing fluid collected during drilling;

a geochemical characteristic analysis unit, configured to acquire geochemical characteristic parameters of the rock slag or the rock powder; and an advanced geological prediction unit, configured to analyze, according to the acquired physical and mechanical parameters of tunnel surrounding rocks and geochemical characteristic parameters, engineering geological conditions ahead of a tunnel face by using a pre-trained deep learning model, obtain at least one of an adverse geology recognition result and a surrounding rock classification result, and then realize advanced geological prediction.

Compared with the prior art, the present disclosure has the following beneficial effects:

(1) According to the present disclosure, a lot of geological information contained during drilling is interpreted based on an advanced drilling testing process by means of testing of drilling parameters and testing of rock slag and rock powder in a flushing fluid. The geological information includes important information such as a variety of physical and mechanical properties and geochemical characteristics of tunnel surrounding rocks.

(2) According to the present disclosure, physical and mechanical parameters and geochemical characteristic parameters of rock mass, capable of comprehensively reflecting characteristics of tunnel surrounding rocks and adverse geology, are selected for effective combination and analysis. Therefore, the disadvantages of misjudgment and omission of tunnel surrounding rock conditions and adverse geologies in the traditional advanced drilling method can be effectively solved, and the comprehensiveness and accuracy of advanced geological prediction results for tunnels can be improved.

(3) According to the present disclosure, data processing is performed on physical and mechanical parameters and geochemical characteristic parameters of massive rock mass by means of artificial intelligence and big data, and a prediction model is established. Thus, an intelligent advanced geological prediction method for quantitative analysis and efficient recognition during drilling is devised to replace the conventional advanced drilling method relying on professionals and making qualitative judgments by experience, thereby improving prediction accuracy and greatly saving manpower and time.

BRIEF DESCRIPTION OF THE DRAWINGS

The accompanying drawings constituting a part of the present disclosure are used to provide further understanding of the present disclosure. Exemplary embodiments of the present disclosure and descriptions thereof are used to explain the present disclosure, and do not constitute an improper limitation to the present disclosure.

DETAILED DESCRIPTION

The present disclosure is further described below with reference to the accompanying drawings and embodiments.

It should be noted that, the following detailed descriptions are all exemplary, and are intended to provide further descriptions of the present disclosure. Unless otherwise specified, all technical and scientific terms used herein have the same meaning as commonly understood by a person of ordinary skill in the art to which the present disclosure belongs.

It should be noted that terms used herein are only for describing specific implementations and are not intended to limit exemplary implementations according to the present disclosure. As used herein, the singular form is also intended to include the plural form unless the context clearly dictates otherwise. In addition, it should further be understood that, terms "include" and/or "include" used in this specification indicate that there are features, steps, operations, devices, components, and/or combinations thereof. Adverse geologies in tunnels mainly include fault fracture zones, karst, alteration zones, weathering zones, etc. The research has showed that the rock mass in the adverse geologies and influence areas thereof is quite different from normal surrounding rocks. Specifically, there is an obvious difference in physical and mechanical properties between the rock mass in the adverse geologies and influence thereof and the normal surrounding rocks of tunnels. The rock mass in the adverse geologies and influence areas thereof is generally weak, broken and filled with clay and water. Therefore, the rock mass has poor integrity and low mechanical strength. Also, there is also an obvious difference between geochemical characteristics of the rock mass in the adverse geologies and influence areas thereof and those of the normal surrounding rocks. Most typically, abnormal elements and minerals generally appear in the adverse geologies and influence areas thereof, including loss, enrichment, and the like of some special minerals and elements.

Therefore, during the recognition and prediction of adverse geologies, change characteristics of physical and mechanical parameters of tunnel surrounding rocks may reflect positions, scales, mechanical properties, rock integrity, and the like of the adverse geologies. Geochemical characteristics of the tunnel surrounding rocks may reflect characteristics such as types and filler properties of the adverse geologies. Obviously, the characteristics of the adverse geologies reflected by the above-mentioned two parameters are complementary. By effectively combining and analyzing the above-mentioned two parameters, the adverse geologies can be refined and accurately recognized.

Figure 1:
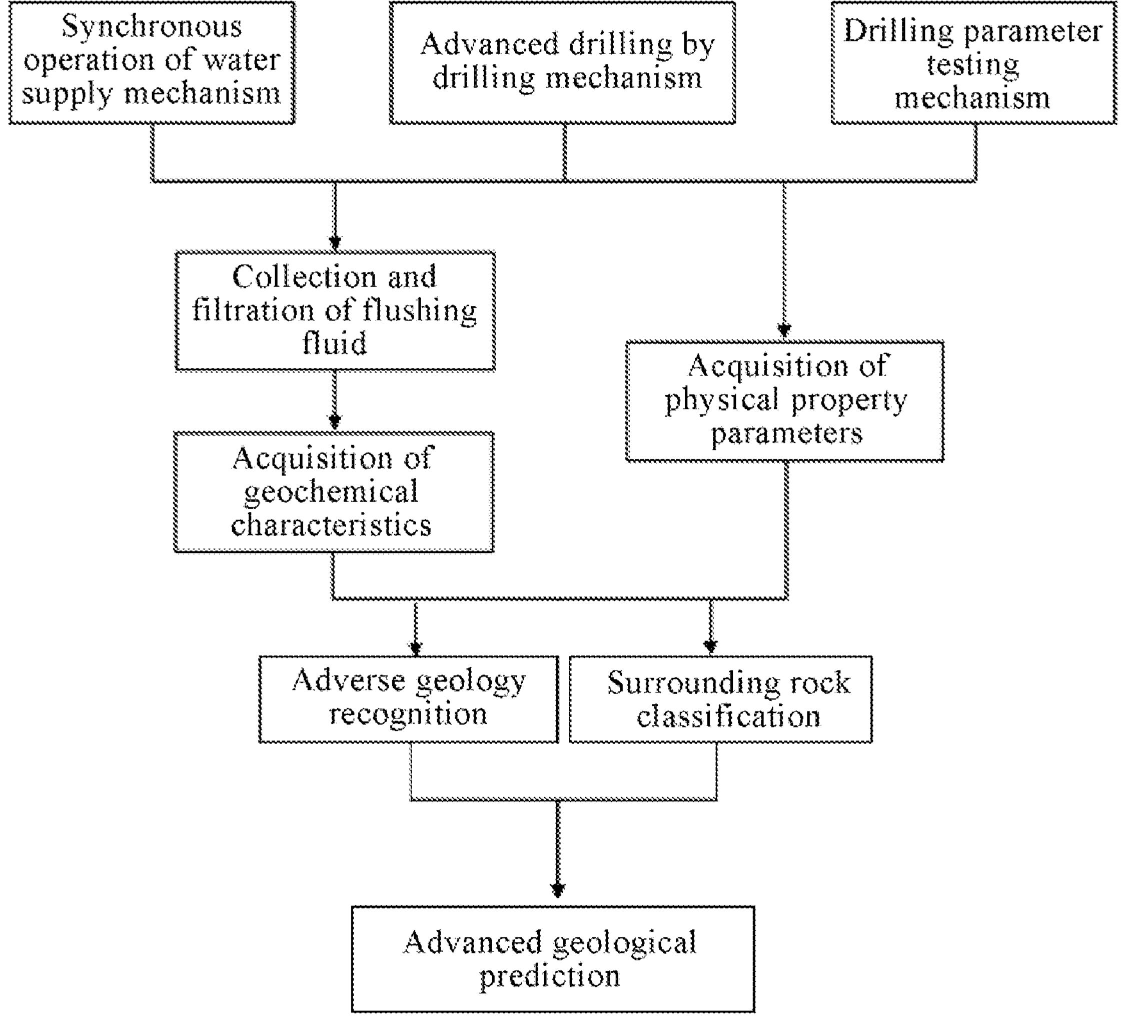
FIG. 1 is a flowchart of an advanced geological prediction method based on perception while drilling in Embodiment 1 of the present disclosure.

Based on the above-mentioned technical concept, in one or more implementations, disclosed is an advanced geological prediction method based on perception while drilling, as shown in FIG. 1, including:

Drilling parameters during drilling are acquired.

Physical and mechanical parameters of tunnel surrounding rocks are obtained by inversion based on the drilling parameters.

Rock slag or rock powder is acquired based on a flushing fluid collected during drilling.

Geochemical characteristic parameters of the rock slag or the rock powder are acquired.

Engineering geological conditions ahead of a tunnel face are analyzed according to the acquired physical and mechanical parameters of tunnel surrounding rocks and geochemical characteristic parameters by using a pre-trained deep learning model, at least one of an adverse geology recognition result and a surrounding rock classification result is obtained, and then advanced geological prediction is realized.

As an optional implementation, the drilling parameters include a drilling displacement, a drilling pressure, a rotational speed, and a drilling torque during drilling. Specifically, in this embodiment, existing devices may be adopted as devices for acquiring the drilling displacement, the drilling pressure, the rotational speed, and the drilling torque, and as devices for measuring elements of rock slag and rock powder and elements of rock mass and anions and cations in a filtered aqueous solution. Detailed introduction is omitted herein.

As an optional implementation, a specific process of obtaining an adverse geology recognition result by using the deep learning model includes: training an adverse geology recognition model based on physical and mechanical parameters of surrounding rocks and geochemical characteristics established by the deep learning algorithm by using an existing data set, analyzing and recognizing actually acquired data by using the trained adverse geology recognition model, and obtaining the adverse geology recognition result.

As an optional implementation, a specific process of obtaining a surrounding rock classification result by using the deep learning model includes: training a surrounding rock classification model based on physical and mechanical parameters of surrounding rocks and geochemical characteristics established by the deep learning algorithm by using the existing data set, analyzing and recognizing actually acquired data by using the trained surrounding rock classification model, and obtaining the surrounding rock classification result.

As a further limitation, a process of mining the existing data set includes: collecting physical and mechanical parameters of compressive strength, cohesion, internal friction angle, abradability, and integrity of rock mass in various adverse geologies and influence areas thereof on a tunneling route, as well as types and content of elements, types and content of minerals, and types and content of anions and cations in an aqueous solution, and mining, based on a data mining mode, physical and mechanical parameters capable of reflecting adverse geology precursor characteristic information and geochemical characteristic gradual evolution information in the rock mass on the tunneling route.

As an optional implementation, the adverse geology recognition model and the surrounding rock classification model are continuously updated and optimized according to the physical and mechanical parameters of tunnel surrounding rocks, the geochemical characteristic parameters, the adverse geology recognition result, and the surrounding rock classification result as a drilling process progresses.

As a further implementation, the adverse geology recognition model or the surrounding rock classification model is established by: establishing, by performing a large number of on-site drilling tests in the early stage, a database for quantitatively characterizing physical and mechanical parameters (i.e., physical and mechanical parameters of tunnel surrounding rocks) such as compressive strength, cohesion, internal friction angle, abradability, and integrity of normal tunnel surrounding rocks and various types of geological rock mass, as well as three geochemical characteristic parameters, including types and content of elements, types and content of minerals, and types and content of anions and cations in an aqueous solution; and revealing, based on a data mining mode, physical and mechanical parameters capable of reflecting geology precursor characteristic information and geochemical characteristic gradual evolution information in the rock mass on a tunneling route. On this basis, an adverse geology recognition model based on perception-while-drilling of physical and mechanical parameters of rock mass and geochemical characteristics is established by using the deep learning algorithm, so as to perceive adverse geology occurrence characteristics ahead of a tunnel face while drilling, including characteristics such as adverse geology types, positions, scales, lithology, mechanical properties, rock mass integrity, and fillers.

Alternatively, a surrounding rock classification model based on perception-while-drilling of physical and mechanical parameters of rock mass and geochemical characteristics is established by using the deep learning algorithm, so as to perceive surrounding rock classification ahead of a tunnel face while drilling.

As a further implementation, during actual drilling, the physical and mechanical parameters of tunnel surrounding rocks and the geochemical characteristic parameters acquired by physical and mechanical property analysis and geochemical characteristic analysis are input into a pre-trained deep learning model (i.e., adverse geology recognition model) so as to realize intelligent recognition of adverse geologies ahead of the tunnel face.

Similarly, the physical and mechanical parameters of tunnel surrounding rocks and the geochemical characteristic parameters acquired by mechanical property analysis and geochemical characteristic analysis are input into a pre-trained deep learning model (i.e., surrounding rock classification model) so as to achieve a recognition result of surrounding rock classification ahead of the tunnel face.

As a further implementation, during actual drilling, the above-mentioned parameter database is continuously supplemented while drilling according to the input physical and mechanical parameters of tunnel surrounding rocks and geochemical characteristic parameters and the adverse geology recognition result, so as to continuously optimize the recognition model and improve the accuracy of intelligent recognition of adverse geologies.

As a further implementation, during actual drilling, the above-mentioned parameter database is continuously supplemented while drilling according to the input physical and mechanical parameters of tunnel surrounding rocks and geochemical characteristic parameters and the surrounding rock classification result, so as to continuously optimize the recognition model and improve the accuracy of surrounding rock classification.

As a further implementation, advanced geological prediction is performed based on at least one of the obtained adverse geology recognition result and surrounding rock classification result.

As an optional implementation, the obtaining physical and mechanical parameters of tunnel surrounding rocks by inversion based on the drilling parameters specifically includes: constructing a mapping relation between the drilling parameters and the physical and mechanical parameters of tunnel surrounding rocks based on historical data; and determining the physical and mechanical parameters of tunnel surrounding rocks based on the mapping relation and the acquired drilling parameters.

Alternatively, a prediction model for physical and mechanical parameters of tunnel surrounding rocks is pre-constructed based on a deep learning algorithm. The deep learning algorithm may adopt a BP neural network model, a CNN neural network model or an RNN neural network model. In this embodiment, the BP neural network model is used as the prediction model for physical and mechanical parameters of tunnel surrounding rocks, inputs drilling parameters, and outputs corresponding physical and mechanical parameters of tunnel surrounding rocks under the current drilling parameters.

As a further limitation, the training process of a tunnel surrounding rock physical and mechanical parameter model includes: taking corresponding data of the drilling parameters and the physical and mechanical parameters of tunnel surrounding rocks in historical data as a training set, and training the tunnel surrounding rock physical and mechanical parameter model based on the training set.

Figure 2:
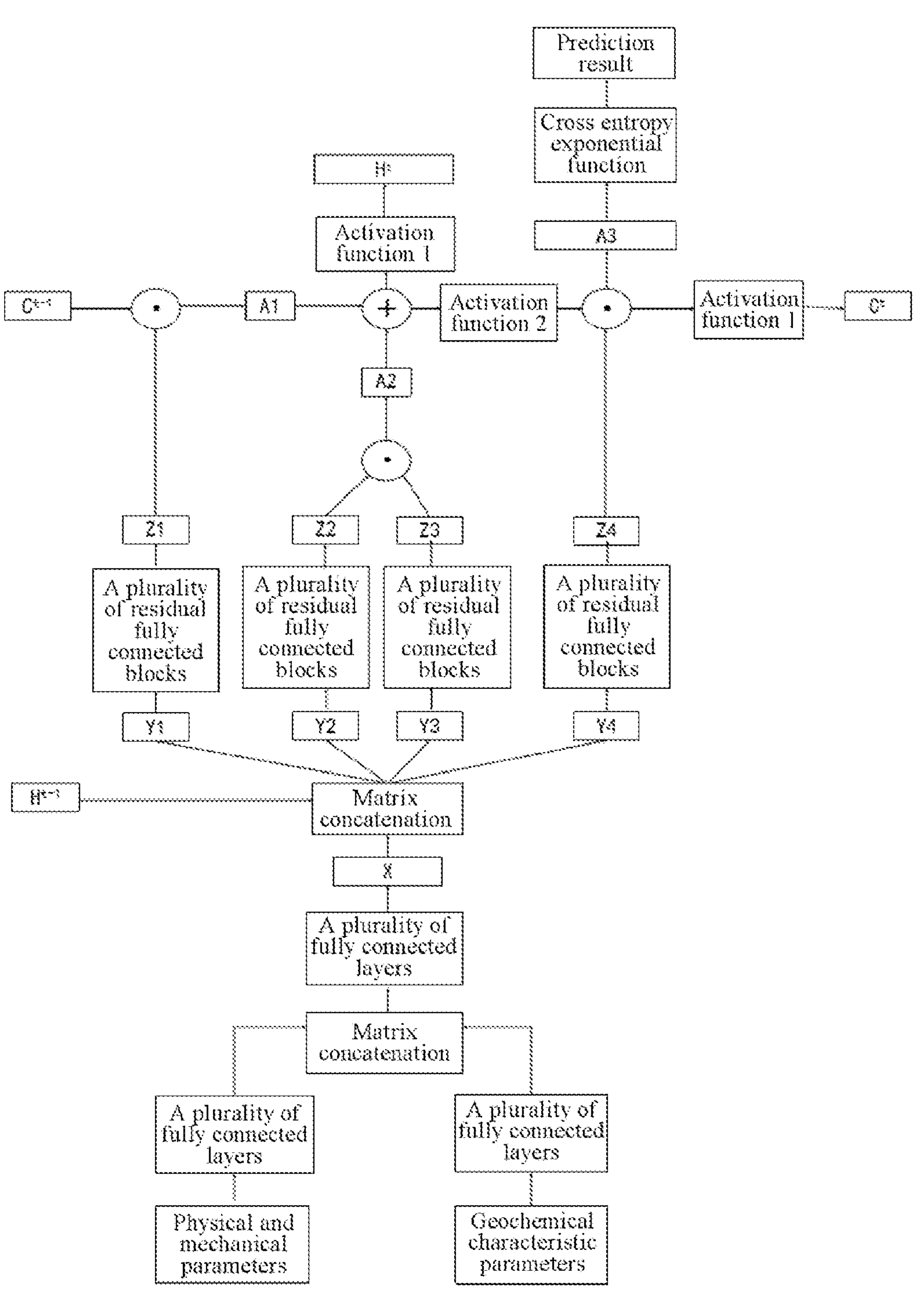
FIG. 2 is a schematic diagram of a network structure of a deep learning model in Embodiment 1 of the present disclosure.

As an optional implementation, a specific process of realizing adverse geology recognition by using the pre-trained deep learning model according to the acquired physical and mechanical parameters of tunnel surrounding rocks and geochemical characteristic parameters (in this embodiment, a neural network structure as shown in FIG. 2 is used, and the neural network structure performs multi-level characteristic extraction on input data by using fully connected layers and residual fully connected layers while introducing an attention mechanism) is as follows:

1) Data Fusion

The process of fusing input data of the deep learning model specifically includes: performing characteristic extraction on the input data respectively based on the fully connected layers, and concatenating extracted characteristics. Specifically:

The obtained two types of data (physical and mechanical parameters of tunnel surrounding rocks and geochemical characteristic parameters) are pre-processed. That is, characteristic extraction is performed on the physical and mechanical parameters of tunnel surrounding rocks and the geochemical characteristic parameters respectively by using a plurality of fully connected layers (FCs). The extracted characteristics are concatenated. The characteristic extraction is continuously performed by using the fully connected layers to obtain a fused characteristic X.

2) Adverse Geology Recognition

As shown in FIG. 2, in the deep learning model, Y1, Y2, Y3, and Y4 are matrices between −1 and 1, which are concatenated by a characteristic extraction vector X and a transfer parameter $H^{t-1}$, multiplied by different weight matrices, and converted by an activation function.

The transfer parameter $H^{t-1}$ is a parameter obtained by self-learning of the deep learning model in the present disclosure. The matrix concatenation in FIG. 2 is performed by using a Concatenation function. The specific concatenation process is as follows:

If a=[1, 2, 3, 4] and b=[5, 6, 7, 8, 9, 11]

a Concatenation result of a and b is [1, 2, 3, 4, 5, 6, 7, 8, 9, 11].

The weight matrix is a result obtained by self-learning of the deep learning model in the present disclosure.

Specifically, characteristic extraction is performed on Y1, Y2, Y3, and Y4 respectively by using a plurality of residual fully connected blocks (ReSs:ResNets) to respectively obtain characteristic vectors Z1, Z2, Z3, and Z4. An attention matrix A1 is obtained by point multiplication of Z1 and C introduced in the previous prediction. An attention matrix A2 is obtained by point multiplication of Z2 and Z3. A1 and A2 are added and activated by an activation function 1 (Sigmoid) to obtain $H^t$ for the next recognition and prediction. A1 and A2 are added, activated by an activation function 2 (Tan H), and then subjected to point multiplication with Z4 to obtain $C^t$ for the next prediction. A1 and A2 are added, activated by the activation function 2 (Tan H), and then subjected to point multiplication with Z4 to obtain an attention matrix A3. This recognition and prediction result can be obtained after the attention matrix is calculated by a cross entropy function (Softmax).

ReSs refers to a structure where a fully connected structure is combined with a residual structure. Of course, the fully connected structure may also be used directly in other implementations.

As an optional implementation, the deep learning model structure described above is also used when performing surrounding rock classification. The difference from the adverse geology recognition process is the difference in the training set used in the model training process.

In one or more embodiments, there is accordingly provided an advanced geological prediction system based on perception while drilling, including:

a drilling parameter acquisition unit, configured to acquire drilling parameters during drilling;

a physical and mechanical property analysis unit, configured to obtain physical and mechanical parameters of tunnel surrounding rocks by inversion based on the drilling parameters;

a rock slag collection unit, configured to acquire rock slag or rock powder based on a flushing fluid collected during drilling;

a geochemical characteristic analysis unit, configured to acquire geochemical characteristic parameters of the rock slag or the rock powder; and an advanced geological prediction unit, configured to analyze, according to the acquired physical and mechanical parameters of tunnel surrounding rocks and geochemical characteristic parameters, engineering geological conditions ahead of a tunnel face by using a pre-trained deep learning model, obtain at least one of an adverse geology recognition result and a surrounding rock classification result, and then realize advanced geological prediction.

In more embodiments, there is also provided:

an electronic device, including a memory, a processor and computer instructions stored on the memory and executed on the processor, where the method of the Embodiment 1 is completed when the computer instructions are executed by the processor. For brevity, details are not described herein again.

It should be understood that in this embodiment, the processor may be a central processing unit (CPU). Alternatively, the processor may be another general purpose processor, a digital signal processor (DSP), an application-specific integrated circuit (ASIC), a field programmable gate array (FPGA) or another programmable logical device, discrete gate or transistor logical device, a discrete hardware component, or the like. The general-purpose processor may be a microprocessor, or the processor may further be any conventional processor, or the like.

The memory may include a read-only memory and a random-access memory, and provide an instruction and data to the processor. A part of the memory may further include a non-volatile random-access memory. For example, the memory may further store information about a device type.

An advanced geological prediction method and system based on perception while drilling provided in the above-mentioned embodiments may be implemented, and have broad application prospects.

The foregoing descriptions are merely exemplary embodiments of the present disclosure, but not intended to limit the present disclosure. Those skilled in the art may make various alterations and variations to the present disclosure. Any modification, equivalent replacement, or improvement made within the spirit and principle of the present disclosure shall fall within the protection scope of the present disclosure.

What is claimed is:

1. An advanced geological prediction method based on perception while drilling, comprising:

acquiring drilling parameters during an advanced drilling;

obtaining physical and mechanical parameters of tunnel surrounding rocks by carrying out an inversion of the drilling parameters through a trained prediction model;

acquiring rock slag or rock powder from a flushing fluid collected during drilling;

acquiring geochemical characteristic parameters of the rock slag or the rock powder;

inputting the physical and mechanical parameters of tunnel surrounding rocks and the geochemical characteristic parameters into a pre-trained deep learning model, to analyze engineering geological conditions ahead of a tunnel face of the tunnel; and carrying out a directional intervention on unfavorable geological conditions recognized and predicted ahead of the tunnel face of the tunnel or adjusting tunnel engineering construction parameters according to analysis results output by the pre-trained deep learning model, to avoid geological disasters in the tunnel;

wherein, using the pre-trained deep learning model to process the physical and mechanical parameters of tunnel surrounding rocks and the geochemical characteristic parameters, and outputting the analysis results, comprises:

performing a characteristic extraction on the input physical and mechanical parameters of tunnel surrounding rocks and the geochemical characteristic parameters respectively by using a first-layer structure of the pre-trained deep learning model comprising more than one fully connected layer, then concatenating the characteristics after the extraction;

performing continuously the characteristic extraction on the characteristics after the concatenation by using a second-layer structure of the pre-trained deep learning model comprising more than one fully connected layer, to obtain a characteristic extraction vector X;

concatenating the characteristic extraction vector X and a transfer parameter $H^{t-1}$, then being multiplied with different weight matrices, and then converted by an activation function, to obtain matrices Y1, Y2, Y3, and Y4 between −1 and 1; wherein, the transfer parameter $H^{t-1}$ is a parameter obtained by self-learning of the pre-trained deep learning model;

performing characteristic extraction the matrices Y1, Y2, Y3, and Y4 respectively by using a plurality of residual fully connected blocks, to obtain characteristic vectors Z1, Z2, Z3, and Z4;

performing point multiplication of the characteristic vector Z1 and a parameter $C^{t-1}$ introduced in a previous analysis of the pre-trained deep learning model, to obtain an attention matrix A1;

performing point multiplication of the characteristic vectors Z2 and Z3, to obtain an attention matrix A2;

obtaining a transfer parameter $H^t$ for a next analysis of the pre-trained deep learning model by adding the attention matrices A1 and A2 and activating them through a first activation function;

obtaining an attention matrix A3 by adding the attention matrices A1 and A2 and activating them through a second activation function, and then point multiplication with the characteristic vector Z4; and obtaining a parameter $C^t$ for the next analysis of the pre-trained deep learning model by activating a result of the point multiplication with the characteristic vector Z4 through the first activation function; and outputting the analysis results obtained by calculating the attention matrix A3 by using a cross entropy function.

2. The advanced geological prediction method based on perception while drilling according to claim 1, wherein the geochemical characteristic parameters comprise types and content of elements in rock mass, types and content of minerals, and types and content of anions and cations in an aqueous solution.

3. The advanced geological prediction method based on perception while drilling according to claim 1, wherein the physical and mechanical parameters of tunnel surrounding rocks comprise compressive strength, cohesion, internal friction angle, abradability, and integrity of rock mass.

4. The advanced geological prediction method based on perception while drilling according to claim 1, wherein training of the deep learning model specifically comprises:

constructing a training set for adverse geology recognition based on an existing data set, and training the deep learning model by using the training set to obtain a trained adverse geology recognition model; and constructing a training set for surrounding rock classification based on the existing data set, and training the deep learning model by using the training set to obtain a trained surrounding rock classification model.

5. The advanced geological prediction method based on perception while drilling according to claim 4, wherein a process of mining the existing data set comprises: collecting physical and mechanical parameters of compressive strength, cohesion, internal friction angle, abradability, and integrity of rock mass in various adverse geologies and influence areas thereof on a tunneling route, as well as types and content of elements, types and content of minerals, and types and content of anions and cations in an aqueous solution, and mining, based on a data mining mode, physical and mechanical parameters capable of reflecting geology precursor characteristic information and geochemical characteristic gradual evolution information in the rock mass on the tunneling route.

6. The advanced geological prediction method based on perception while drilling according to claim 1, wherein the corresponding deep learning model is continuously updated and optimized according to the physical and mechanical parameters of tunnel surrounding rocks, the geochemical characteristic parameters and the adverse geology recognition result as a drilling process progresses; and the corresponding deep learning model is continuously updated and optimized according to the physical and mechanical parameters of tunnel surrounding rocks, the geochemical characteristic parameters and the surrounding rock classification result.

7. The advanced geological prediction method based on perception while drilling according to claim 1, wherein the obtaining physical and mechanical parameters of tunnel surrounding rocks by inversion based on the drilling parameters specifically comprises: constructing a mapping relation between the drilling parameters and the physical and mechanical parameters of tunnel surrounding rocks based on historical data; and determining the physical and mechanical parameters of tunnel surrounding rocks based on the mapping relation and the acquired drilling parameters.

8. The advanced geological prediction method based on perception while drilling according to claim 1, wherein the first activation function is Sigmoid.

9. The advanced geological prediction method based on perception while drilling according to claim 1, wherein the second activation function is TanH.

10. The advanced geological prediction method based on perception while drilling according to claim 1, wherein the cross entropy function is Softmax.

11. The advanced geological prediction method based on perception while drilling according to claim 1, wherein the different weight matrices are obtained by the self-learning of the pre-trained deep learning model.

* * * * *